US009960298B2

(12) United States Patent
Newman et al.

(10) Patent No.: US 9,960,298 B2
(45) Date of Patent: May 1, 2018

(54) PREPARATION OF COPPER-RICH COPPER INDIUM (GALLIUM) DISELENIDE/DISULFIDE NANOPARTICLES

(71) Applicant: Nanoco Technologies Ltd., Manchester (GB)

(72) Inventors: Christopher Newman, Holmfirth (GB); Ombretta Masala, Manchester (GB); Paul Kirkham, Lancashire (GB); Cary Allen, Manchester (GB); Stephen Whitelegg, Stockport (GB)

(73) Assignee: Nanoco Technologies Ltd., Manchester (GB)

(*) Notice: Subject to any disclaimer, the term of this patent is extended or adjusted under 35 U.S.C. 154(b) by 302 days.

(21) Appl. No.: 14/541,861

(22) Filed: Nov. 14, 2014

(65) Prior Publication Data
US 2015/0136213 A1    May 21, 2015

Related U.S. Application Data (60) Provisional application No. 61/904,780, filed on Nov. 15, 2013.

(51) Int. Cl.
*H01L 31/032* (2006.01)
*H01L 31/075* (2012.01)
(Continued)

(52) U.S. Cl.
CPC ........ *H01L 31/0322* (2013.01); *C01B 19/002* (2013.01); *C01G 15/006* (2013.01);
(Continued)

(58) Field of Classification Search
None
See application file for complete search history.

(56) References Cited

U.S. PATENT DOCUMENTS

| 2005/0072461 A1 | 4/2005 | Kuchinski et al. |
| 2005/0202589 A1 | 9/2005 | Basol |

(Continued)

FOREIGN PATENT DOCUMENTS

| CN | 102694057 | * | 3/2011 |
| WO | 2009016354 A1 | | 2/2009 |
| WO | 2009068878 A2 | | 6/2009 |

OTHER PUBLICATIONS

Jiang Tang et al. "Synthesis of Colloidal CuGaSe2, CuInSe2 Nanoparticles", Chenistry of Materials, American Chemical Society, US, vol. 20, No. 22 Nov. 25, 2008 (Nov. 25, 2008), pp. 6906-6910, XP008162012, ISSN: 0897-4756 table 1.
(Continued)

*Primary Examiner* — Sheng H Davis
(74) *Attorney, Agent, or Firm* — Blank Rome, LLP (57) ABSTRACT

A method for the preparation of copper indium gallium diselenide/disulfide (CIGS) nanoparticles utilizes a copper-rich stoichiometry. The copper-rich CIGS nanoparticles are capped with organo-chalcogen ligands, rendering the nanoparticles processable in organic solvents. The nanoparticles may be deposited on a substrate and thermally processed in a chalcogen-rich atmosphere to facilitate conversion of the excess copper to copper selenide or copper sulfide that may act as a sintering flux to promote liquid phase sintering and thus the growth of large grains. The nanoparticles so produced may be used to fabricate CIGS-based photovoltaic devices.

12 Claims, 5 Drawing Sheets

(51) Int. Cl.
*C01B 19/00* (2006.01)
*C01G 15/00* (2006.01)
*H01L 31/0203* (2014.01)
*H01L 31/0392* (2006.01)
*B82Y 30/00* (2011.01)
*B82Y 40/00* (2011.01)

(52) U.S. Cl.
CPC .... *H01L 31/0203* (2013.01); *H01L 31/03923* (2013.01); *H01L 31/075* (2013.01); *B82Y 30/00* (2013.01); *B82Y 40/00* (2013.01); *C01P 2002/72* (2013.01); *C01P 2004/03* (2013.01); *C01P 2006/40* (2013.01); *Y02E 10/541* (2013.01)

(56) References Cited

U.S. PATENT DOCUMENTS

| | | | |
|---|---|---|---|
| 2007/0093006 A1 | 4/2007 | Basol | |
| 2008/0066802 A1 | 3/2008 | Reddy | |
| 2008/0257201 A1 | 10/2008 | Harris et al. | |
| 2009/0139574 A1* | 6/2009 | Pickett | B82Y 30/00 136/265 |
| 2010/0242800 A1* | 9/2010 | Chuang | C23C 18/1204 106/287.18 |
| 2011/0175065 A1 | 7/2011 | de la Vega et al. | |
| 2012/0063990 A1 | 3/2012 | Tuan et al. | |
| 2012/0313200 A1 | 12/2012 | Jackrel | |
| 2013/0087745 A1* | 4/2013 | Fujdala | H01L 31/0264 252/501.1 |
| 2013/0233202 A1* | 9/2013 | Cao | C09D 11/037 106/31.13 |
| 2014/0249324 A1 | 9/2014 | Harris et al. | |

OTHER PUBLICATIONS

Ming Li et al: Fabrication and characterization of ordered CuIn (1~x) Ga x Se 2 nanopore films via template-based electrodeposition Background,Nanoscale Research Letters,Jan. 1, 2012 {Jan. 1, 1012), pp. 1-6, XP055163393, DOI: 10.1186/1556-276X-7-675 Retrieved from the Internet:URL:http://www.nanoscaleresle.tt.com/ conten t/7/1/675 [retrieved on Jan. 20, 2015] table 1.

N. Naghavi et al: "Buffer layers and transparent conducting oxides for chalcopyrite Cu(In,Ga)(S,Se)2 based thin film photovoltaics: present status and current developments", Progress in Photovoltaics: Research and Applications, vol. 18, No. 6, Aug. 24, 2010 (Aug. 24, 2010), pp. 411-433, XP055029315,ISSN: 1062-7995, DOI: 10.1002/pip.955 p. 412-p. 418 p. 422-p. 424.

Kushiya K et al: "Interface control to enhance the fill factor over 0.70 in a large-area CIS-based thin-film PV technology",Thin Solid Films, Elsevier-Sequoia S.A. Lausanne, CH, vol. 517, No. 7, Feb. 2, 2009 (Feb. 2, 2009), pp. 2108-2110, XP025928576, ISSN: 0040-6090, DOI: 10.1016/J.TSF.2008.10.125 [retrieved on Nov. 11, 2008] the whole document.

* cited by examiner

PREPARATION OF COPPER-RICH COPPER INDIUM (GALLIUM) DISELENIDE/DISULFIDE NANOPARTICLES

CROSS-REFERENCE TO RELATED APPLICATIONS

This application claims the benefit of U.S. Provisional Application No. 61/904,780 filed on Nov. 15, 2013.

STATEMENT REGARDING FEDERALLY SPONSORED RESEARCH OR DEVELOPMENT

Not Applicable

BACKGROUND OF THE INVENTION

1. Field of the Invention

The present invention generally relates to materials for photovoltaic cells. More particularly, it relates to a method for preparing copper indium gallium diselenide/disulfide (GIGS) nanoparticles. The invention further relates to CIGS-based devices formed from nanoparticle-based precursor inks.

2. Description of the Related Art including information disclosed under 37 CFR 1.97 and 1.98

For commercial viability, photovoltaic (PV) cells must generate electricity at a competitive cost to fossil fuels. To meet these costs, the PV cells must comprise low cost materials along with an inexpensive device fabrication process and with moderate to high conversion efficiency of sunlight to electricity. For a device-building method to succeed, the materials synthesis and device fabrication must be commercially scalable.

The current photovoltaic market remains dominated by silicon wafer-based solar cells (first-generation solar cells). However, the active layer in these solar cells is made of silicon wafers having a thickness ranging from microns to hundreds of microns because silicon is a relatively poor absorber of light. These single-crystal wafers are very expensive to produce because the process involves fabricating and slicing high-purity, single-crystal silicon ingots, and is also very wasteful.

The high cost of crystalline silicon wafers has led the industry to look at cheaper materials to make solar cells and for this reason much development work has focused on producing high efficiency thin film solar cells where material costs are significantly reduced compared to silicon.

Semiconductor materials like copper indium gallium diselenides and disulfides ($Cu(In,Ga)(S,Se)_2$, herein referred to as "GIGS") are strong light absorbers and have band gaps that match well with the optimal spectral range for PV applications. Furthermore, because these materials have strong absorption coefficients, the active layer in the solar cell is required to be only a few microns thick.

Copper indium diselenide ($CuInSe_2$) is one of the most promising candidates for thin-film PV applications due to its unique structural and electrical properties. Its band gap of 1.0 eV is well matched with the solar spectrum. $CuInSe_2$ solar cells can be made by the selenization of $CuInS_2$ films because, during the selenization process, Se replaces S and the substitution creates volume expansion, which reduces void space and reproducibly leads to high-quality, dense, $CuInSe_2$ absorber layers. [Q. Guo, G. M. Ford, H. W. Hillhouse and R. Agrawal, *Nano Lett.*, 2009, 9, 3060] Assuming complete replacement of S with Se, the resulting lattice volume expansion is ~14.6%, which is calculated based on the lattice parameters of chalcopyrite (tetragonal) $CuInS_2$ (a=5.52 Å, c=11.12 Å) and $CuInSe_2$ (a=5.78 Å, c=11.62 Å). This means that the $CuInS_2$ nanocrystal film can be easily converted to a predominantly selenide material, by annealing the film in a selenium-rich atmosphere. Therefore, $CuInS_2$ is a promising alternative precursor for producing $CuInSe_2$ or $CuIn(S,Se)_2$ absorber layers.

The theoretical optimum band gap for absorber materials is in the region of 1.2-1.4 eV. By incorporating gallium into $CuIn(S,Se)_2$ nanoparticles, the band gap can be manipulated such that, following selenization, a $Cu_xIn_yGa_zS_aSe_b$ absorber layer is formed with an optimal band gap for solar absorption.

Conventionally, costly vapor phase or evaporation techniques (for example metal-organic chemical vapor deposition (MO-CVD), radio frequency (RF) sputtering, and flash evaporation) have been used to deposit CIGS films on a substrate. While these techniques deliver high-quality films, they are difficult and expensive to scale to larger-area deposition and higher process throughput.

One of the major advantages of using nanoparticles of CIGS is that they can be dispersed in a medium to form an ink that can be printed on a substrate in a similar way to inks in a newspaper-like process. The nanoparticle ink or paste can be deposited using low-cost printing techniques such as spin coating, slit coating and doctor blading. Printable solar cells could replace the standard conventional vacuum-deposited methods of solar cell manufacture because the printing processes, especially when implemented in a roll-to-roll processing framework, enables a much higher throughput.

The synthetic methods developed so far offer limited control over the particle morphology, and particle solubility is usually poor which makes ink formulation difficult.

The challenge is to produce nanoparticles that overall are small, have a low melting point, narrow size distribution and incorporate a volatile capping agent, so that they can be dispersed in a medium and the capping agent can be eliminated easily during the film baking process. Another challenge is to avoid the inclusion of impurities, either from synthetic precursors or organic ligands that could compromise the overall efficiency of the final device. The applicant's co-pending U.S. patent applications published as Nos. 2009/0139574 and 2014/0249324 describe the scalable synthesis of CIGS nanoparticles capped with organo-chalcogen ligands for use as precursors for the formation of photovoltaic devices, and are hereby incorporated by reference in their entireties.

One of the challenges associated with the nanoparticle-based CIGS deposition approach is to achieve large grains after thermal processing. Grain sizes on the order of the film thickness are desirable since grain boundaries act as electron-hole recombination centers.

Elemental dopants, such as sodium [R. Kimura, T. Mouri, N. Takuhai, T. Nakada, S. Niki, A. Yamada, P. Fons, T. Matsuzawa, K. Takahashi and A. Kunioka, Jpn. *J. Appl. Phys.*, 1999, 38, L899] and antimony, [M. Yuan, D. B. Mitzi, W. Liu, A. J. Kellock, S. J. Chey and V. R. Deline, *Chem. Mater.*, 2010, 22, 285] have been reported to enhance the grain size of CIGS films and thus the power conversion efficiency (PCE) of the resulting devices.

In another approach, a binary copper chalcogenide compound is added the CIGS precursor(s) to promote grain growth. Copper chalcogenide compounds with a lower melting point than CIGS can act as a sintering flux to promote grain growth of the CIGS layer at a temperature well-below its melting point. It is thought that, at the sintering temperature, the sintering flux is a liquid that wets the CIGS grains such that they dissolve in the liquid. This is believed to promote particle bonding, leading to higher densification rates and lower sintering temperatures, and is referred to as "liquid phase sintering."

Casteleyn et al. studied the influence of Cu, CuSe, Cu$_2$Se and Se additives on CuInSe$_2$ films. [M. Casteleyn, M. Burgelman, B. Depuydt, A. Niemegeers and I. Clemminck, *IEEE First World Conference on Photovoltaic Energy Conversion*, 1994, 1, 230]. It was found that, in a selenium-rich atmosphere, Cu-rich phases formed CuSe, which acted as a flux above its melting point (523° C.) to promote liquid phase sintering and thus promote grain growth.

Kim et al. applied a layer of sputtered Cu$_2$Se onto the surface of a sputtered Cu—In—Ga film that was subsequently selenised to form a CIGS layer. [M. S. Kim, R. B. V. Chalapathy, K. H. Yoon and B. T. Ahn, *J. Electrochem Soc.*, 2010, 157, B154] Cu$_2$Se was found to promote grain growth when the overall Cu/(In+Ga) ratio was greater than 0.92.

Cu$_2$S powder (melting point: 435° C.) has been added to Cu$_2$In$_2$O$_5$ nanoparticles prior to sulfurization, to promote the conversion to chalcopyrite CuInS$_2$ and facilitate grain growth. [C.-Y. Su, D. K. Mishra, C.-Y. Chiu and J.-M. Ting, *Surf. Coat. Technol.*, 2013, 231, 517]

The applicant's U.S. patent application No. 61/847,639 describes the preparation of copper selenide nanoparticles, which can be added to CIGS materials as a flux to promote grain growth. The nanoparticle melting point is lower than that of the corresponding bulk copper selenide phase, enabling copper selenide nanoparticles to effect liquid phase sintering at a reduced temperature.

In the prior art methods to promote grain growth using binary copper chalcogenide precursors, a pre-fabricated copper chalcogenide compound is employed. Thus, there is a need for a method to form the copper chalcogenide phase in situ, to reduce the processing requirements associated with the formation of a CIGS film with large grains. Herein, a method is described to enhance the grain size of CIGS films using a nanoparticle-based deposition approach, wherein the CIGS nanoparticles are copper-rich. The nanoparticles can be processed in a chalcogen-rich atmosphere to facilitate conversion of the excess copper to copper selenide or copper sulfide that acts as a sintering flux to promote liquid phase sintering and thus the growth of large grains. The stoichiometry of the resulting CIGS absorber layer can be controlled by both the nanoparticle stoichiometry and post-annealing processing steps, such as KCN etching.

BRIEF SUMMARY OF THE INVENTION

In certain embodiments, the present invention comprises a method for the synthesis of copper-rich CIGS nanoparticles. The copper-rich CIGS nanoparticles are capped with organo-chalcogen ligands, rendering the nanoparticles processable in organic solvents. The nanoparticles may be deposited on a substrate and thermally processed in a chalcogen-rich atmosphere to facilitate conversion of the excess copper to copper selenide or copper sulfide that may act as a sintering flux to promote liquid phase sintering and thus the growth of large grains. The stoichiometry of the resulting CIGS absorber layer can be controlled by both the nanoparticle stoichiometry and post-annealing processing steps, such as KCN etching, which may be employed to selectively eliminate excess binary copper chalcogenide phases. The CIGS absorber layer may subsequently be incorporated into a photovoltaic device.

DETAILED DESCRIPTION OF THE INVENTION

Herein, a method for the preparation of CIGS nanoparticles is described. Processing of the nanoparticles to form an ink, which can be deposited to form a CIGS-based film, and subsequent processing to form a PV device, is also described. During device processing, excess copper in the nanoparticles may react with a chalcogen source to form a binary chalcogenide that acts as a flux to facilitate liquid phase sintering of the CIGS layer. The term "CIGS" should herein be understood to describe any material of the form Cu$_x$In$_y$Ga$_z$S$_a$Se$_b$. Typically, x≈y+z≈1, and a+b≈2, but the material need not be stoichiometric. For example, in some embodiments, CIGS nanoparticles are described where x>y+z.

During device processing, excess copper in the nanoparticles reacts with a chalcogen source to form one or more binary chalcogenide phases in situ that may act as a sintering flux that facilitates the growth of large grains. The chalcogen source with which the excess copper reacts may be provided by the nanoparticles (e.g., from the organo-chalcogen capping ligand) and/or by an external chalcogenization process, such as selenization.

In a first embodiment, nanoparticles of the form Cu$_x$In$_y$Ga$_z$S$_a$ are prepared, where x>y+z, and a≈2, and including doped derivatives thereof. The nanoparticles are capped with one or more organo-thiol ligands, for example 1-octanethiol.

In a second embodiment, nanoparticles of the form Cu$_x$In$_y$Ga$_z$Se$_b$ are prepared, where x>y+z, and b≈2, and including doped derivatives thereof. The nanoparticles are capped with one or more organo-selenol ligands, for example 1-octane selenol.

In a third embodiment, nanoparticles of the form Cu$_x$In$_y$Ga$_z$Se$_b$ are prepared, where x>y+z, and a+b≈2, and including doped derivatives thereof. The nanoparticles are capped with one or more organo-thiol and/or organo-selenol ligands, for example 1-octanethiol, 1-octane selenol, etc.

Figure 1:
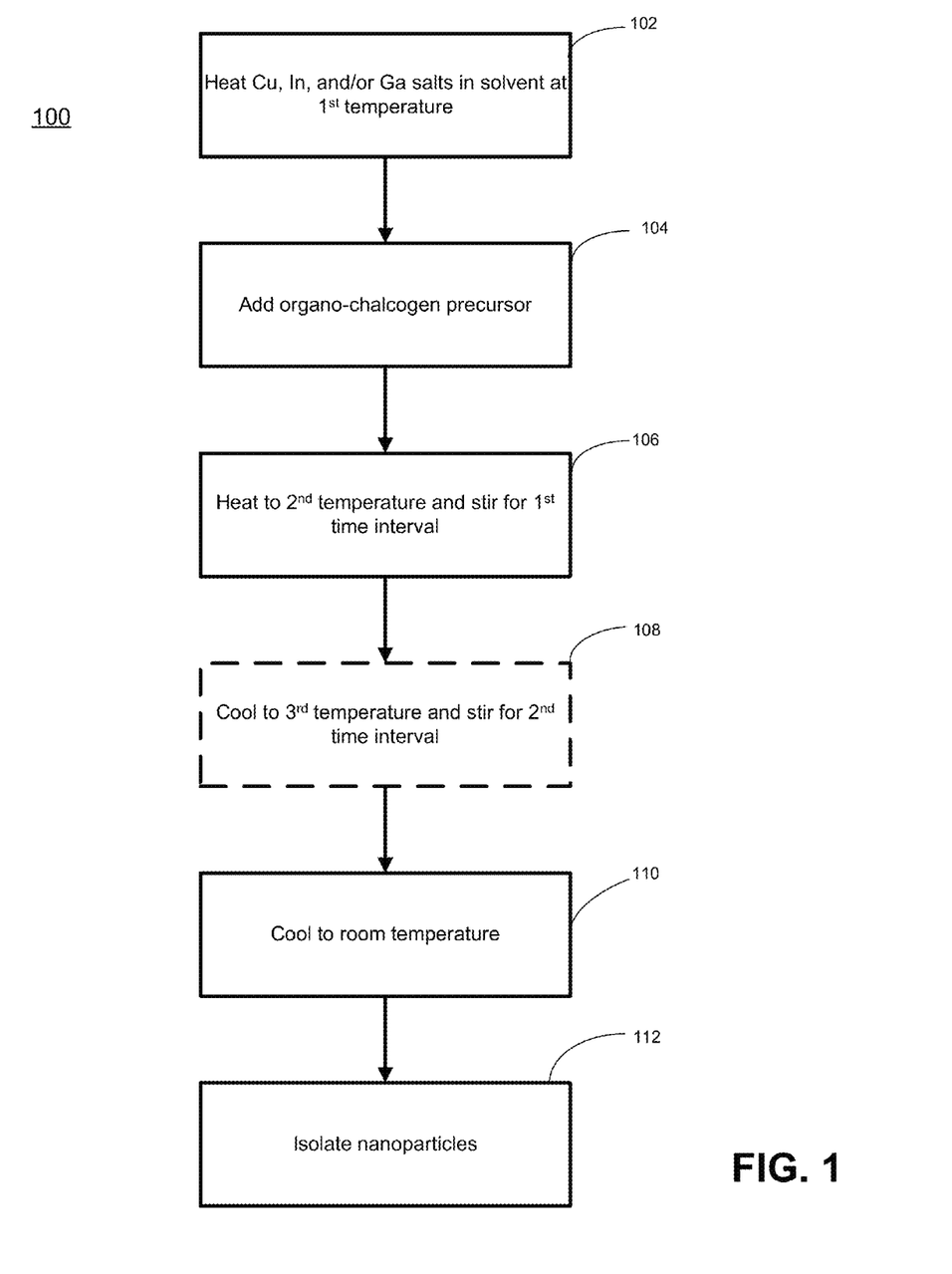
FIG. 1 is a flow chart showing a first method of preparing Cu-rich CIGS nanoparticles according to certain embodiments of the invention.

According to certain embodiments of the invention, a first method to prepare Cu-rich CIGS nanoparticles is as follows (with reference numbers to flowchart 100 of FIG. 1):

a) Heat Cu, In and/or Ga salts in a solvent at a first temperature (102).

b) Add an organo-chalcogen precursor (104).
c) Heat the reaction solution to a second temperature and stir for a first time interval (106).
d) Optionally, cool the reaction solution to a third temperature and stir for a second time interval (108).
e) Cool the reaction solution to room temperature (110).
f) Isolate the nanoparticles (112).

The Cu, In and Ga salts may include, but are not restricted to, acetates, acetylacetonates, and halides, e.g. chlorides, bromides, iodides. The relative ratio of the salts is used to control the stoichiometry of the resulting nanoparticles. One skilled in the art will realize that the molar ratio of the precursor salts to be added depends on both the desired nanoparticle stoichiometry and the relative reactivity of the precursors. In certain preferred embodiments, the molar ratio of Cu salts to the combined total of In and Ga salts is between about 1:0.65 and about 1:0.85.

The Cu, In and Ga salts are combined in a solvent. In some embodiments, the solvent is a non-coordinating solvent. Examples include, but are not restricted to, 1-octadecene, benzylether, diphenylether, and heat transfer fluids (e.g., Therminol® 66).

The Cu, In and Ga salts are heated in the solvent to a first temperature. In some embodiments, the first temperature lies between room temperature and 150° C., for example 100° C.

An organo-chalcogen precursor is added to the reaction mixture at the first temperature. The organo-chalcogen precursor acts as both a chalcogen source and a ligand that caps the nanoparticle surface to provide solubility. In some embodiments, the organo-chalcogen precursor may have a boiling point below around 250° C. to facilitate its removal from the surface of the nanoparticles during device processing. This is desirable, since carbon residues remaining in the CIGS layer prior to processing can have a detrimental effect on device performance. Suitable organo-chalcogen precursors may be of the form R—X—H, where R is an alkyl or aryl group and X is S or Se. Examples include, but are not restricted to, 1-octanethiol, 1-octane selenol, and 1-dodecane selenol.

Following the addition of the organo-chalcogen precursor, the reaction solution is heated to a second temperature and stirred for a first time interval. In some embodiments, the second temperature is higher than the first temperature. For example, the second temperature may fall in the range 160-240° C., more particularly around 200° C. In certain embodiments, the first time interval ranges from 30 minutes-10 hours, more particularly around 2-6 hours.

Optionally, the reaction solution is cooled to a third temperature below that of the second temperature and the reaction solution is annealed for a second time interval, for example around 4-24 hours, more particularly around 18 hours.

After cooling to room temperature, the nanoparticles are isolated from the reaction solution. The nanoparticles may be isolated by any method known in the prior art, such as the addition of one or more solvents to precipitate the nanoparticles from solution, followed by collection via centrifugation or filtration. One skilled in the art will realize that the choice of solvent(s) to isolate the nanoparticles depends on the chemical nature of the solvent in which the nanoparticle synthesis is conducted.

Figure 2:
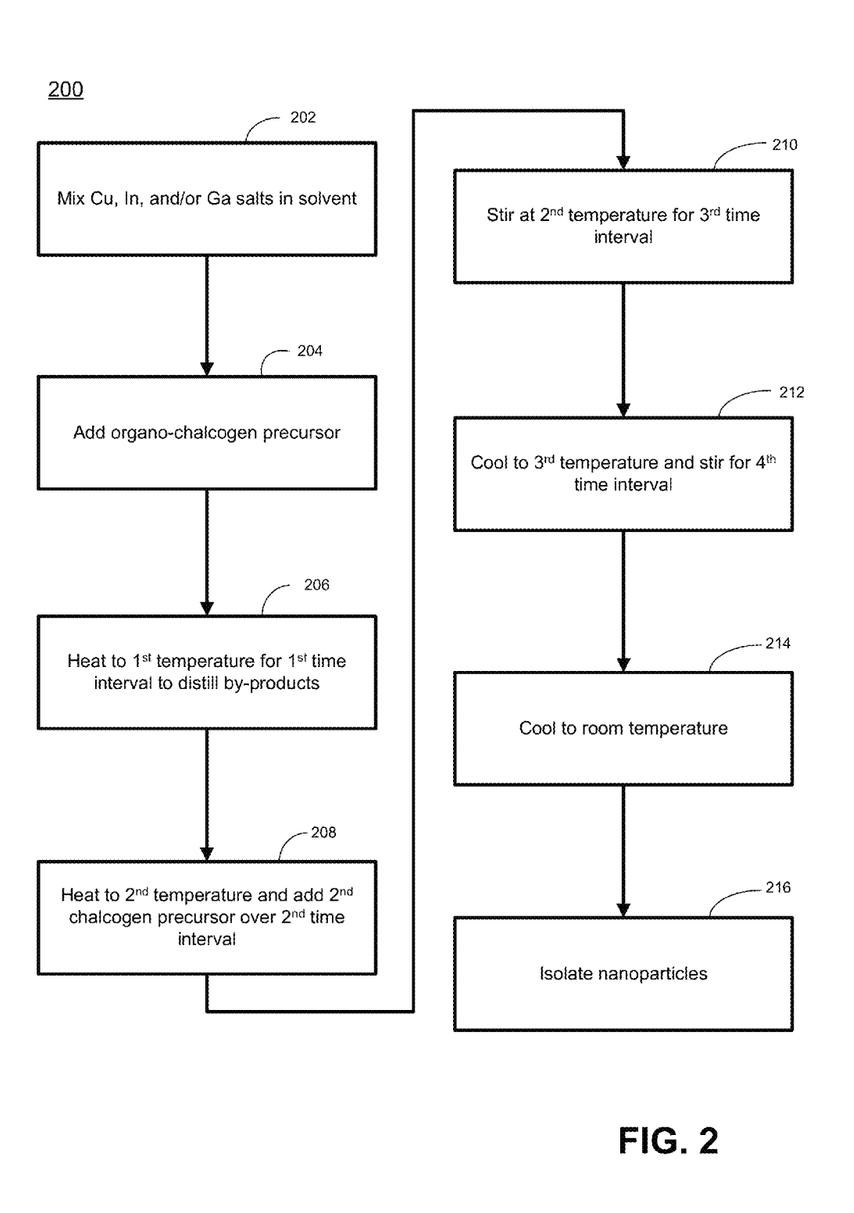
FIG. 2 is a flow chart showing a second method of preparing Cu-rich CIGS nanoparticles according to certain embodiments of the invention.

According to certain embodiments, a second method to prepare Cu-rich CIGS nanoparticles is as follows (with reference numbers to flowchart 200 of FIG. 2):
a) Mix Cu, In and/or Ga salts in a solvent (202).
b) Add an organo-chalcogen precursor (204).
c) Heat the reaction solution to a first temperature and stir for a first time interval to distill any volatile by-products (206).
d) Heat the reaction solution to a second temperature and add a second chalcogen precursor over a second time interval (208).
e) Stir the reaction solution at the second temperature for a third time interval (210).
f) Cool the reaction solution to a third temperature and stir for a fourth time interval (212).
g) Cool the reaction solution to room temperature (214).
h) Isolate the nanoparticles (216).

The Cu, In and Ga salts may include, but are not restricted to, acetates, acetylacetonates, and halides, e.g., chlorides, bromides, iodides. The relative ratio of the salts is used to control the stoichiometry of the resulting nanoparticles. One skilled in the art will realize that the molar ratio of the precursor salts to be added depends on both the desired nanoparticle stoichiometry and the relative reactivity of the precursors.

The Cu, In and Ga salts are combined in a solvent. In some embodiments, the solvent is a non-coordinating solvent. Examples include, but are not restricted to, 1-octadecene, benzylether, diphenylether, and heat transfer fluids such as Therminol® 66 (Solutia, Inc., St. Louis, Mo. 63141).

An organo-chalcogen precursor is added to the reaction mixture. The organo-chalcogen precursor acts as both a chalcogen source and a ligand that caps the nanoparticle surface to provide solubility. In some embodiments, the organo-chalcogen precursor may have a boiling point below around 250° C. to facilitate its removal from the surface of the nanoparticles during device processing. This is desirable, since carbon residues remaining in the CIGS layer prior to processing can have a detrimental effect on device performance. Suitable organo-chalcogen precursors may be of the form R—X—H, where R is an alkyl or aryl group and X is S or Se. Examples include, but are not restricted to, 1-octanethiol, 1-octane selenol, and 1-dodecane selenol.

Following the addition of the organo-chalcogen precursor, the reaction solution is heated to a first temperature and stirred for a first time interval to distill any volatile by-products. One skilled in the art will recognize that the first temperature depends on the chemical nature of the metal precursor salts and the boiling point(s) of the by-product(s) thus formed. For example, an organo-chalcogen precursor may react with metal acetate salts to form acetic acid as a by-product; the acetic acid can be distilled at a first temperature above its boiling point (117-118° C.). The first time interval should be sufficient to effect the distillation of all of the volatile by-product(s). In some embodiments, the first time interval is 30 minutes.

The reaction solution is subsequently heated to a second temperature, at which a second chalcogen precursor is added over a second time interval. In certain embodiments, the second temperature lies in the range 120-160° C., for example 140° C. In particular embodiments, the second chalcogen precursor is an elemental chalcogen dissolved in a coordinating solvent such as, but not restricted to, trioctylphosphine sulfide (TOP/S) or trioctylphosphine selenide (TOP/Se). The second chalcogen precursor may be added drop wise, for example at a rate of 0.5 mmol-1 mol per minute, more particularly around 1-10 mmol per minute, for example around 1.4 mmol per minute.

The reaction solution is stirred at the second temperature for a third time interval. In some embodiments, the third time interval lies in the range 30 minutes-2 hours, for example around 1 hour.

The reaction solution is cooled to a third temperature below that of the second temperature, then stirred for a fourth time interval. In some embodiments, the third temperature lies in the range 80-120° C., for example around 90° C. In certain embodiments, the fourth time interval is between 3 to 6 hours, for example 4½ hours.

After cooling to room temperature, the nanoparticles are isolated from the reaction solution. The nanoparticles may be isolated by any method known in the prior art, such as the addition of one or more solvents to precipitate the nanoparticles from solution, followed by collection via centrifugation or filtration. One skilled in the art will realize that the choice of solvent(s) to isolate the nanoparticles depends on the chemical nature of the solvent in which the nanoparticle synthesis is conducted.

Figure 3:
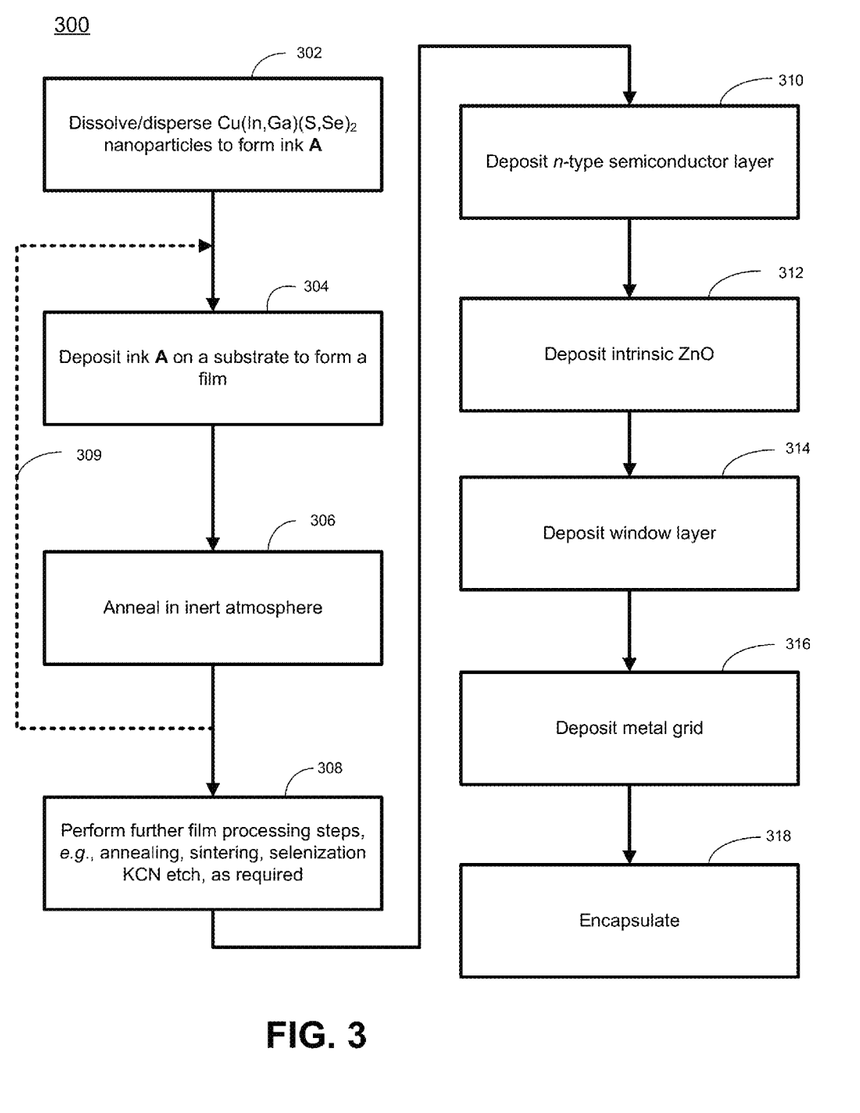
FIG. 3 is a flow chart showing a method of preparing a photovoltaic device using Cu-rich CIGS nanoparticles, according to certain embodiments of the invention.

According to certain embodiments, a CIGS device is prepared from Cu-rich nanoparticles as follows (with reference numbers to flowchart 300 of FIG. 3):

a) Dissolve/disperse nanoparticles in a solvent, to form an ink, A, (302).
b) Deposit the ink, A, on a substrate to form a film (304).
c) Anneal in an inert atmosphere (306).
d) Repeat steps b) and c), until the annealed film reaches the desired thickness (309).
e) Perform further film processing steps, e.g., annealing, sintering, selenization, KCN etching, as required (308).
f) Deposit an n-type semiconductor layer to form a junction (310).
g) Deposit intrinsic ZnO to form an extended depletion layer (312).
h) Deposit a window layer (314).
i) Deposit a metal grid (316).
j) Encapsulate the device (318).

In particular embodiments, the nanoparticles are ternary, quaternary or quinary chalcogenides of the form $CuIn_wGa_xSe_yS_z$, where $0 \leq w$, $x<1$, $w+x \leq 1$, $y$, $z \geq 0$ and $y+z \approx 2$, including doped species, alloys and combinations thereof, but are not restricted to these, and can include non-stoichiometric derivatives thereof. In certain embodiments, $0.7 \leq w+x<1$, for example $0.7 \leq w+x \leq 0.8$. The nanoparticles must be soluble or dispersible in the solvent.

The solvent must be capable of dissolving or dispersing the nanoparticles. Those skilled in the art will realize that the choice of solvent depends on the surface coating of the nanoparticles, such as the chemical nature of the capping ligands. Preferably, the solvent is an organic solvent. A particular example is toluene, but other solvents known to those skilled in the art may be used, including, but not restricted to, alkanes (e.g., hexane), chlorinated solvents e.g., (dichloromethane, chloroform, etc.), ketones (e.g., isophorone), ethers (e.g., anisole), terpenes (e.g., α-terpinene, limonene, etc.), etc.

Optionally, further additives may be incorporated into the nanoparticle ink, for example to modify the coating properties such as the rheology. In some embodiments, oleic acid is added at a concentration between 2-5 wt. % of the total ink formulation.

Any suitable method may be used to deposit the nanoparticle ink, A. Examples include, but are not restricted to, spin coating, slit coating, doctor blading and inkjet printing.

The nanoparticle ink, A, may be deposited on any suitable substrate. Examples include, but are not restricted to, indium tin oxide (ITO), molybdenum-coated bare glass, and molybdenum-coated soda-lime glass (SLG).

In some embodiments, one or more anode buffer layers are deposited onto the substrate and processed, prior to the deposition of ink A. The anode buffer layer may, for example, be composed of CIGS nanoparticles with a stoichiometry differing to that of the nanoparticles used to formulate the ink A. In particular embodiments, the anode buffer layer is indium-rich, i.e. the ratio of Cu/In<1. In certain embodiments, the thickness of each anode buffer layer is 100 nm, for example between 50-70 nm.

In particular embodiments, steps b) and c) are repeated until the CIGS film thickness is greater than or equal to 1 μm. For example, the film thickness may lie in the range 1.0-2.0 μm.

One skilled in the art will realize that the annealing temperature and time following the deposition of each CIGS layer will depend on the nature of the solvent and organic components of the ink formulation. In certain embodiments, the films are annealed at a first, lower temperature in the region of 250-300° C., for example around 270° C., for between 3-7 minutes, for example around 5 minutes, then the films are subsequently annealed at a second, higher temperature in the region of 400-430° C., for example around 415° C., for between 3-7 minutes, for example around 5 minutes.

In some embodiments, the film processing steps may comprise a sulfurization process, during which the CIGS film is annealed in a sulfur-rich atmosphere. Any suitable sulfur source may be used to provide the sulfur-rich atmosphere, such as a solid or liquid sulfur compound that can be vaporized, or a gaseous sulfur source. In a particular embodiment, the sulfur-rich atmosphere is provided by $H_2S$ gas at a concentration of 10%, for example 2-5%, in an inert carrier gas such as, but not restricted to, $N_2$.

The film processing steps comprise a selenization process, during which the CIGS film is annealed in a selenium-rich atmosphere. The selenization process may facilitate the conversion of the excess copper in the CIGS nanoparticles to copper selenide, forming a flux to facilitate liquid phase sintering and the growth of large grains. When using $Cu(In,Ga)S_2$ nanoparticles, the selenization process may also effect the partial or complete conversion of a $CuInS_2$ layer to $CuInSe_2$. Any suitable selenium source may be used to provide the selenium-rich atmosphere, such as a solid or liquid selenium compound that can be vaporized, or a gaseous selenium source. In a particular embodiment, the selenium-rich atmosphere is provided by $H_2Se$ gas at a concentration of 10%, for example 2-5%, in an inert carrier gas such as, but not restricted to, $N_2$.

The film processing steps may further comprise a KCN etch. Etching of the CIGS film in KCN solution can be used to selectively remove excess copper selenide and/or copper sulfide phases from the CIGS absorber layer. The etching process may be carried out in 5-15% KCN solution, for example 10% KCN solution, for a time period of 30 seconds-5 minutes, for example 3 minutes.

Any suitable n-type semiconductor layer may be deposited. Examples include, but are not restricted to, CdS, Zn(O,S), ZnO, and ZnS.

In some embodiments, the window layer consists of aluminum zinc oxide (AZO), but other transparent, conducting oxides known to those skilled in the art, such as indium tin oxide (ITO) and boron-doped zinc oxide (BZO) may be used.

EXAMPLES

Example 1: Synthesis of Copper-Rich $CuInS_2$ Nanoparticles Capped with 1-Octanethiol (Cu:In=1:0.75)

$In(OAc)_3$ (32.057 g, 120.0 mmol), Cu(OAc) (19.157 g, 156.3 mmol) and 240 mL of benzylether were mixed in a 1-L round-bottom flask fitted with a Liebig condenser and collector. The mixture was degassed at 100° C. for 90 minutes, then back-filled with $N_2$. Degassed 1-octanethiol (192 mL, 1.10 mol) was added and the mixture was heated to 200° C. and stirred for 2 hours, before being allowed to cool to 160° C. and left to stir for approximately 18 hours. The mixture was cooled to room temperature.

The nanoparticles were isolated in air, via the addition of solvents, followed by centrifugation.

Characterization of the nanoparticles by CPS disc centrifuge analysis (CPS Instruments Inc., Prairieville, Pa.) revealed a particle size on the order of 3 nm.

Example 2: Synthesis of Copper-Rich CuInS$_2$Nanoparticles Capped with 1-Octanethiol (Cu:In=1:0.84)

In(OAc)$_3$ (3.995 g, 13.7 mmol) and Cu(OAc) (2.422 g, 19.8 mmol) were mixed in a 100 mL round-bottom flask fitted with a Liebig condenser and collector, purged with $N_2$. 30 mL of degassed benzylether were added, then the mixture was heated to 100° C. Degassed 1-octanethiol (24 mL, 138 mmol) was added and the mixture was heated to 200° C. and stirred for 6 hours, before being allowed to cool to room temperature.

The nanoparticles were isolated in air, via the addition of solvents, followed by centrifugation.

Example 3: Synthesis of Copper-Rich CuInSe$_2$ Nanoparticles Capped with 1-Octane Selenol (Cu:In=1:0.84)

15 mL of 1-octadecene were degassed at approximately 110° C. for 45 minutes in a round-bottom flask fitted with a Liebig condenser and collector, then cooled to room temperature under $N_2$. Cu(OAc) (0.79 g, 6.4 mmol) and In(OAc)$_3$ (1.54 g, 5.3 mmol) were added, then the mixture was degassed for a further 10 minutes at 140° C. The mixture was cooled to room temperature. 1-Octane selenol (12 mL, 68 mmol) was added and the solution was heated. Acetic acid began to distill at 120° C. and was removed from the collector with a syringe. The solution was heated between 135-145° C. for 30 minutes to allow the remainder of the acetic acid to distill, then trioctylphosphine selenide (1.71 M, 8 mL, 14 mmol) was added over 10 minutes. The solution was stirred at 140° C. for 1 hour. The solution was cooled to 90° C., then annealed for 4% hours, before being cooled to room temperature.

The nanoparticles were isolated in air, via the addition of solvents, followed by centrifugation.

Example 4: Thin Film Prepared from Copper-Rich CuInS$_2$ Nanoparticles

Copper-rich CuInS$_2$ nanoparticles (Cu:In=1:0.76) capped with 1-octanethiol were dissolved in toluene to form a 200 mg/mL solution, B.

An anode buffer layer of CuInS$_2$ was deposited on molybdenum-coated SLG substrates by spin coating, using a spin speed of 3000 rpm. The anode buffer layer was annealed at 270° C. for 5 minutes and 415° C. for 5 minutes to remove the ligand, yielding a layer thickness of ~50 nm.

The ink, B, was deposited on top of the anode buffer layer by spin coating, using a spin speed of 1500 rpm. The film was annealed at 270° C. for 5 minutes, then 415° C. for 5 minutes to remove the organic components of the ink formulation. The process was repeated four times further, until the film thickness was greater than 1 µm.

The films were annealed under a selenium-rich atmosphere, using 2.18% by volume $H_2Se$ in $N_2$, at 500° C. for 60 minutes.

Figure 4:
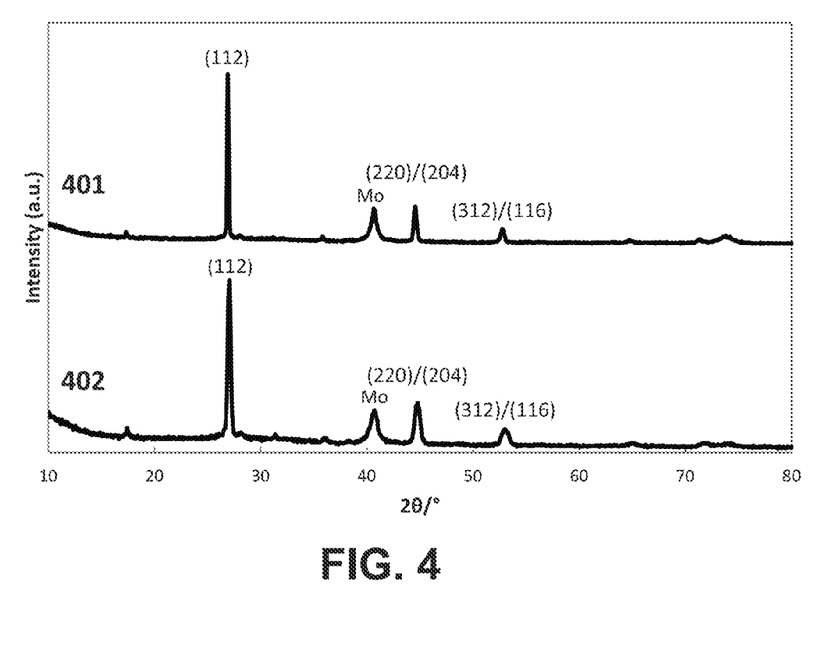
FIG. 4 compares the X-ray diffraction pattern, 401, of a CIGS film prepared with Cu-rich CIGS nanoparticles according to the Examples, to that of a CIGS film prepared with near-stoichiometric CIGS nanoparticles, 402.

FIG. 4 compares the X-ray diffraction (XRD) pattern of the film, 401, with that of a film prepared according the same procedure using near-stoichiometric CuInS$_2$ nanoparticles with a Cu:In ratio of 1:0.95, 402. Analysis of the full-width at half-maximum (FWHM) of the (112) reflection shows a significantly narrower peak width for film prepared with the Cu-rich nanoparticles (2θ=0.17°) compared to that prepared with near-stoichiometric nanoparticles (2θ=0.36°). Since peak FWHM is inversely proportional to particle size, the results suggest that the Cu-rich nanoparticles promote grain growth.

Example 5: Thin Film Prepared from Copper-Rich CuInS$_2$Nanoparticles with an Indium-Rich Buffer Layer Copper-rich CuInS$_2$ nanoparticles (Cu:In=1:0.85) capped with 1-octanethiol were dissolved in toluene to form an ink, C.

A buffer layer of In-rich Cu(In,Ga)S$_2$ nanoparticles (Cu:In:Ga=1:1.13:0.16) capped with 1-dodecanethiol was deposited on Mo-coated SLG substrates by spin coating, using a spin speed of 3000 rpm. The anode buffer layer was annealed at 270° C. for 5 minutes and 415° C. for 5 minutes to remove the ligand. The process was repeated once more.

The ink, C, was deposited on top of the buffer layer by spin coating, using a spin speed of 3000 rpm. The film was annealed at 270° C. for 5 minutes, then 415° C. for 5 minutes to remove the organic components of the ink formulation. The process was repeated seven times, in order to achieve a total film thickness greater than 1 µm.

The films were annealed under a selenium-rich atmosphere using 2.18% by volume $H_2Se$ in $N_2$, at 500° C. for 60 minutes.

Figure 5:
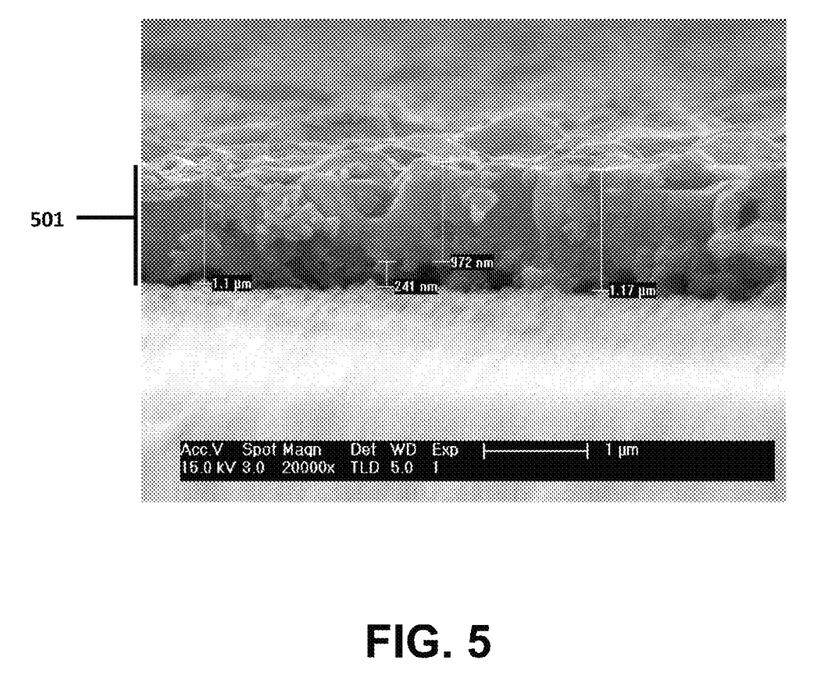
FIG. 5 is a scanning electron microscopy image of a CIGS film prepared from Cu-rich CIGS nanoparticles prepared according to the Examples.

FIG. 5 shows a scanning electron microscopy (SEM) image of the film. The CIGS layer, e.g., shows full crystallization, with grain sizes on the order of 1.1 µm.

Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A method for preparing copper-rich CIGS nanoparticles having the general formula $Cu_xIn_yGa_zS_aSe_b$, wherein y+z=1, a+b=2, and x>y+z, the method comprising:
   heating a copper salt together with at least one salt selected from the group consisting of indium salts and gallium salts in a solvent at a first temperature to produce a reaction solution;
   adding an organo-chalcogen precursor to the reaction solution;
   heating the reaction solution to a second temperature while stirring for a first time interval;
   cooling the reaction solution to a third temperature, the third temperature being between the second temperature and room temperature;

stirring the reaction solution for a second time interval at the third temperature to anneal the reaction solution, the second time interval being between about 4 hours and about 24 hours;

cooling the reaction solution from the third temperature to room temperature; and isolating nanoparticles from the reaction solution.

2. The method recited in claim 1 wherein the molar ratio of Cu salts to the combined total of In and Ga salts is between about 1:0.65 and about 1:0.85.

3. The method recited in claim 1 wherein the group consisting of copper salts, indium salts and gallium salts comprises salts selected from the group consisting of acetates, acetylacetonates, chlorides, bromides, and iodides.

4. The method recited in claim 1 wherein the solvent is a non-coordinating solvent.

5. The method recited in claim 4 wherein the non-coordinating solvent is selected from the group consisting of 1-octadecene, benzylether, diphenylether and heat transfer fluids comprising hydrogenated terphenyls.

6. The method recited in claim 1 wherein the first temperature is between room temperature and about 100° C.

7. The method recited in claim 1 wherein the organochalcogen precursor is of the form R—X—H, where R is an alkyl or aryl group and X is sulfur or selenium.

8. The method recited in claim 1 wherein the organochalcogen precursor is selected from the group consisting of 1-octanethiol, 1-octane selenol, and 1-dodecane selenol.

9. The method recited in claim 1 wherein the second temperature is higher than the first temperature.

10. The method recited in claim 9 wherein second temperature is between about 160° C. and about 240° C.

11. The method recited in claim 1 wherein the second time interval is around 18 hours.

12. The method recited in claim 1 wherein isolating the nanoparticles comprises precipitating the nanoparticles from the reaction solution by the addition of at least one other solvent.

* * * * *